(12) United States Patent
Suzuki

(10) Patent No.: US 6,737,721 B1
(45) Date of Patent: May 18, 2004

(54) SHALLOW TRENCH ISOLATION STRUCTURE FOR A BIPOLAR TRANSISTOR

(75) Inventor: Hisamitsu Suzuki, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 09/691,456

(22) Filed: Oct. 18, 2000

(30) Foreign Application Priority Data

Oct. 18, 1999 (JP) ............................................. 11-294885

(51) Int. Cl.$^7$ ........................ H01L 29/00; H01L 27/12; H01L 29/76; H01L 29/94; H01L 31/113
(52) U.S. Cl. ........................ 257/500; 257/501; 257/502; 257/511; 257/370; 257/374
(58) Field of Search ................................. 257/500–502, 257/517, 511, 526, 350, 370–374, 513–515, 592–593, 506, 510, 378, 552; 438/353, 359, 200, 202, 203, 204, 216, 234

(56) References Cited

U.S. PATENT DOCUMENTS

| | | | | |
|---|---|---|---|---|
| 5,661,329 A | * | 8/1997 | Hiramoto et al. | 257/347 |
| 5,933,719 A | * | 8/1999 | Nii et al. | 438/202 |
| 6,030,864 A | * | 2/2000 | Appel et al. | 438/203 |
| 6,150,697 A | * | 11/2000 | Teshigahara et al. | 257/335 |
| 6,355,537 B1 | * | 3/2002 | Seefeldt | 438/405 |

FOREIGN PATENT DOCUMENTS

| | | |
|---|---|---|
| JP | 52-035582 | 3/1977 |
| JP | 01-164067 | 6/1989 |
| JP | 01-290235 | 11/1989 |
| JP | 02-022857 | 1/1990 |
| JP | 02-026062 | 1/1990 |
| JP | 02-151050 | 6/1990 |
| JP | 03-053561 | 3/1991 |
| JP | 05-251653 | 9/1993 |
| JP | 06-021365 | 1/1994 |
| JP | 07-037892 | 2/1995 |
| JP | 09-092658 | 4/1997 |
| JP | 09-115998 | 5/1997 |
| JP | 10-173035 | 6/1998 |
| JP | 10-242295 | 9/1998 |
| JP | 11-017039 | 1/1999 |
| JP | 11-251449 | 9/1999 |

* cited by examiner

Primary Examiner—Eddie Lee
Assistant Examiner—Samuel A Gebremariam
(74) Attorney, Agent, or Firm—Katten Muchin Zavis Rosenman

(57) ABSTRACT

A semiconductor device has an isolation area having a shallow trench isolation (STI) structure for isolating device areas for transistor elements. The isolation area for a bipolar transistor has a first annular trench encircling a n-type collector well, a second annular trench encircling the first annular trench and an annular p-type diffused region disposed between the first annular trench and the second annular trench while in contact with the annular trenches. The plurality of isolation trenches in a single isolation area prevents a dishing portion of the substrate after a CMP process without causing a short-circuit failure.

10 Claims, 18 Drawing Sheets

SHALLOW TRENCH ISOLATION STRUCTURE FOR A BIPOLAR TRANSISTOR

BACKGROUND OF THE INVENTION (a) Field of the Invention

The present invention relates to a semiconductor device having a shallow trench isolation (STI) structure and, more particularly, to a STI structure for isolation of bipolar transistors in a silicon semiconductor device.

(b) Description of the Related Art

Bipolar transistors have a somewhat complicated structure and fabricated by a more complicated process compared to MOSFETs. The bipolar transistors, however, have several advantages of higher operational speed, higher current driveability and low noise characteristic, and thus are used in a LSI as important constituent elements. For example, a BiCMOS device wherein bipolar transistors and MOSFETs are integrated in a single chip has advantages of both the bipolar transistors and the CMOSFETs, and thus widely used in a variety of applications.

FIG. 1 shows a conventional semiconductor device including bipolar transistors separated by a LOCOS technique, and FIG. 2 is a sectional view taken along line II—II in FIG. 1. The semiconductor device 100 is fabricated on a p-type silicon substrate (p-substrate) 102, and includes a pair of NPN bipolar transistors 104A and 104B, which are disposed in a plane symmetry with respect to a plane passing through the center of a p-well 122.

Each of the pair of bipolar transistors 104A and 104B includes an n-welt 107A or 107B constituting a collector region, a p-type intrinsic base region 108A or 108B disposed on the top portion of the n-well 107A or 107B, an $n^+$-type emitter region 110A or 110B disposed on the intrinsic base region 108A or 108B, and a $p^+$-type extrinsic base region 112A or 112B disposed on the intrinsic base region 108A or 108B adjacent to the emitter region 110A or 110B.

An $n^+$-type collector contact region 114A or 114B is disposed in the top portion of the n-well 107A or 107B, and is electrically isolated from the extrinsic base region 112A or 112B by the LOCOS film 106. In other words, the intrinsic base region 108A or 108B, the emitter region 110A or 110B and the extrinsic base region 112A or 112B are electrically isolated from the collector contact region 114A or 114B by the LOCOS film 106.

The extrinsic base region 112A or 112B, the emitter region 110A or 110B and the collector contact region 114A or 114B are provided with a base electrode 116A or 116B, an emitter electrode 118A or 118B and a collector electrode 120A or 120B, respectively. The base electrode 116A or 116B and the collector electrode 120A or 120B are made of silicide layers such as including $CoSi_2$ and $TiSi_2$, whereas the emitter electrode 118A or 118B has a two-layer structure including a polysilicon film 118a and a silicon oxide film 118b. A pair of side walls 118c made of silicon oxide film are disposed on respective side surfaces of the two-layer structure.

The p-well 122 is disposed right under the LOCOS film 106 for encircling the n-well 107A or 107B and isolating the n-wells 107A and 107B from each other by using the isolation function of a p-n junction.

With the development of finer patterning and higher integration of the semiconductor devices, bipolar transistors and MOSFETs are also requested to have finer patterns. This also requires a finer isolation structure, which the LOCOS technique cannot afford due to the presence of a bird's beak in the LOCOS film. A STI structure which is expected to meet the finer patterning is thus noticed in place of using the LOCOS structure.

FIGS. 3A to 3F show a fabrication process for the STI structure in a semiconductor device. In FIG. 3A, a thin $SiO_2$ film (not shown) is first formed on a silicon substrate 130, followed by deposition of a $Si_3N_4$ film 132 thereon by a CVD technique. Then, a photoresist film is formed on the $Si_3N_4$ film 132 and subjected to patterning to form an etching mask 134 having openings for isolation trenches. The $Si_3N_4$ film 132 is then etched using the etching mask 134 to form a $Si_3N_4$ hard mask 136, as shown in FIG. 3B. The function of the thin $SiO_2$ film is to prevent damages from occurring on the main surface of the silicon substrate 130 due to the stress by the $Si_3N_4$ film 132. Thereafter, the silicon substrate is subjected to a dry etching using the $Si_3N_4$ hard mask 136 to form shallow isolation trenches 138, as shown in FIG. 3C.

Subsequently, an insulator film, for example, a $SiO_2$ film 140 is deposited on the entire surface including the surfaces of the hard mask 136 and the silicon substrate 130 to fill the shallow trenches 138, as shown in FIG. 3D. In an alternative, the insulator film may be a $TEOS-SiO_2$ film deposited by a TEOS-CVD technique.

The $SiO_2$ film 140 is then subjected to a CMP process until the $Si_3N_4$ hard mask 136 is exposed, as shown in FIG. 3E. In this process, the $Si_3N_4$ film has a lower polishing rate compared to the $SiO_2$ film and thus functions as a stop layer for the polishing.

The $Si_3N_4$ hard mask 136 is then removed by etching to obtain the STI structure shown in FIG. 3F, wherein device areas are isolated from on another by the shallow isolation trenches 142.

Consolidated LSIs, wherein an analog signal circuit and a digital signal circuit are integrated in a single chip, are more and more used as the semiconductor devices for use in cellular phones etc. In general, the area for the analog signal circuit has a fewer number of transistor elements compared to the area for the digital signal circuit. Thus, the transistor elements are more sparsely disposed in the analog circuit area compared to the transistor elements in the digital circuit area.

The polishing rate of the CMP process generally depends on the density of the underlying pattern. More specifically, an area of the underlying pattern having a higher-density convex portions of the silicon substrate, which is not the subject area of the CMP process itself, has a lower polishing rate compared to another area of the underlying pattern having a lower-density convex portions of the silicon substrate.

Accordingly, as shown in FIG. 4A, in the conventional STI structure fabricated by using the CMP process, the isolation area of the silicon substrate having the lower-density convex portions due to the presence of a wider isolation trench therein may have a dishing portion (or depression) in the isolation area after the CMP process. As a result, after the removal of the $Si_3N_4$ film, as shown in FIG. 4B, the silicon substrate may have the dishing portion in the isolation area having a wider trench or lower-density concave portions. This causes a problem of an uneven top surface or a step of the silicon substrate, wherein the isolation area is lower than the device area which has higher-density convex portions.

Referring to FIG. 5A which shows the detail of the portion of the NPN bipolar transistor 104A, the step formed by the dishing as described above resides between the wider shallow trench for the isolation area 106 and the device area for the bipolar transistor 104A. This causes an exposure of a part of the n-well 107A underlying the p⁺-type extrinsic base region 112A at the step after the removal of the silicon oxide film on the diffused region for formation of the silicide layer on the silicon substrate, as shown in FIG. 5A.

After the base electrode 116A made of a silicide such as CoSi$_2$ is formed on the extrinsic base region 112A, the base electrode 116A may be in short-circuit with the n-well 107A if the height of the dishing portion is large. This applies to both the bipolar transistors 104A and 104B in FIG. 2, and degrades the yield rate of the products.

As for the MOSFET, the dishing portion may cause formation of a parasitic transistor at the step portion if the gate electrode extends from the device area along the step toward the dishing portion, as illustrated in FIG. 5B. This causes degradation of transistor characteristics of the MOSFET.

SUMMARY OF THE INVENTION

In view of the above, it is an object of the present invention to provide a STI structure in a semiconductor device, which is substantially free from the dishing portion of the isolation area to allow the transistor elements therein to have excellent characteristics by providing an isolation area having high-density convex portions during a CMP process.

The present invention provides a semiconductor device including a silicon substrate, and a bipolar transistor having a collector well having a first conductivity-type, an intrinsic base region having a second conductivity-type and received in the collector well and an emitter region having the first conductivity-type and received in the intrinsic base region, a first annular isolation trench encircling the collector well, a second annular isolation trench encircling the first annular isolation trench, and an annular diffused region disposed between the first annular isolation trench and the second isolation trench while being in contact with the first and second isolation trenches.

In accordance with the semiconductor device of the present invention, by providing the first and second annular isolation trenches and annular diffused region sandwiched therebetween in an isolation area, the semiconductor device is free from a dishing portion in the isolation area due to high-density convex portions of the silicon substrate, whereby a transistor element isolated by the isolation area has excellent transistor characteristics. The second annular isolation trench may be associated with third and fourth annular isolation trenches, for example, encircling the second annular trench. The term "annular trench" as used herein means that a stripe trench is of an endless shape. It is not necessary that the outer or inner edge of the annular trench form a circle, and the outer or inner edge may form a rectangle or a square.

The above and other objects, features and advantages of the present invention will be more apparent from the following description, referring to the accompanying drawings.

PREFERRED EMBODIMENT OF THE INVENTION

Before describing embodiments of the present invention, the principle of the present invention will be described for a better understanding of the present invention.

The present inventor noticed that the dishing portion is formed by the difference in the polishing rate which depends on the underlying pattern. The dishing portion is generally formed in the isolation area wherein the convex portions of the silicon substrate are sparse. The present inventor thus conceived that the isolation area should have higher-density convex portions, which can be achieved by providing a plurality of shallow trenches having a smaller width in a single isolation area, without increasing the occupied area for the isolation area.

Patent Publication JP-A-10-173035 describes a semiconductor device having isolation areas each formed by a plurality of shallow isolation trenches having a width equal to the width of the shallow isolation trenches formed in the device area for isolating adjacent transistor elements. Dummy diffused regions are formed between two of the shallow trenches in the isolation areas.

Figure 6A:
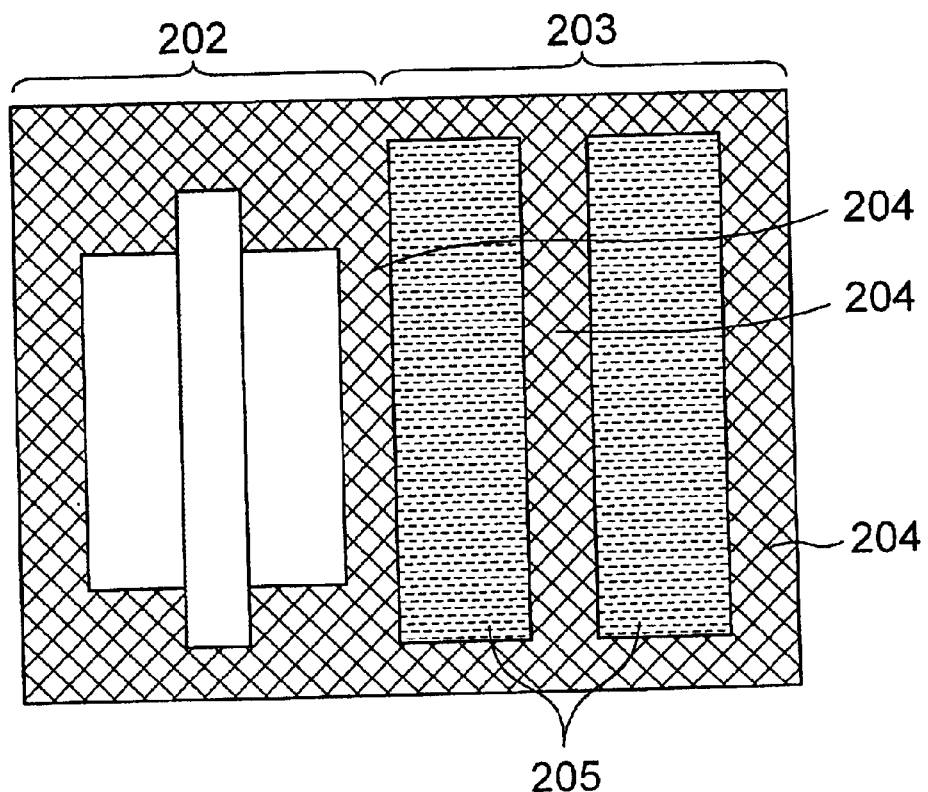
FIG. 6A is a top plan view of a comparative example of a semiconductor device having an improved STI structure.
Figure 6B:
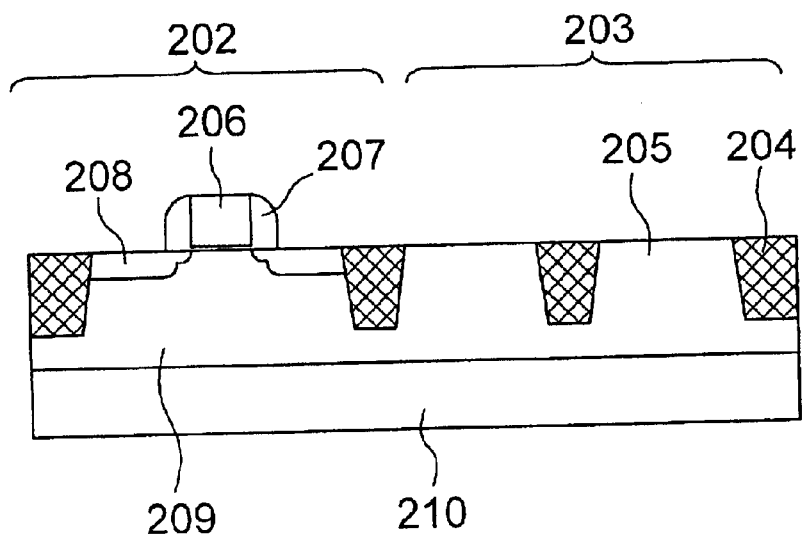
FIG. 6B is a sectional view thereof.

Referring to FIGS. 6A and 6B showing an example of the structure described in the above publication, the isolation area 203 includes three shallow trenches 204 and two dummy diffused regions 205 between each two of the shallow trenches 203. The shallow trench 204 in the isolation area 203 has a width equal to the width of the shallow isolation trench 204 disposed in the device area 202 for isolation of transistor elements (MOSFETs). It is stated that this STI structure has an advantage in that the density of the convex portions is equal between the device area 202 and the isolation area 203, and thus the dishing portion is not formed in the isolation area 203 after the CMP process. The dummy diffused region 205 has no specific function differently from the diffused regions 208 which constitute a MOSFET in association with a gate electrode 206.

Figure 1:
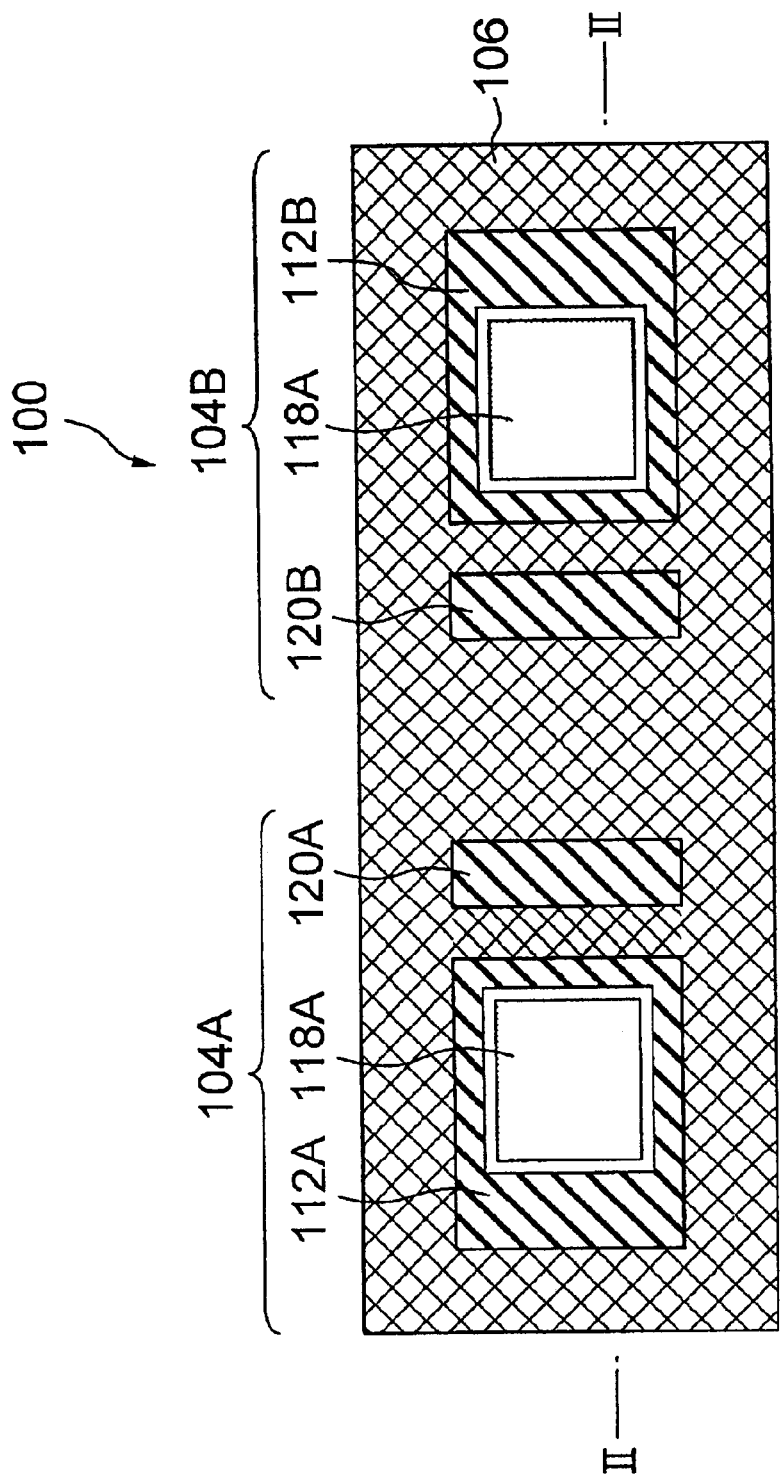
FIG. 1 is a top plan view of a semiconductor device having bipolar transistors isolated by LOCOS film.
Figure 2:
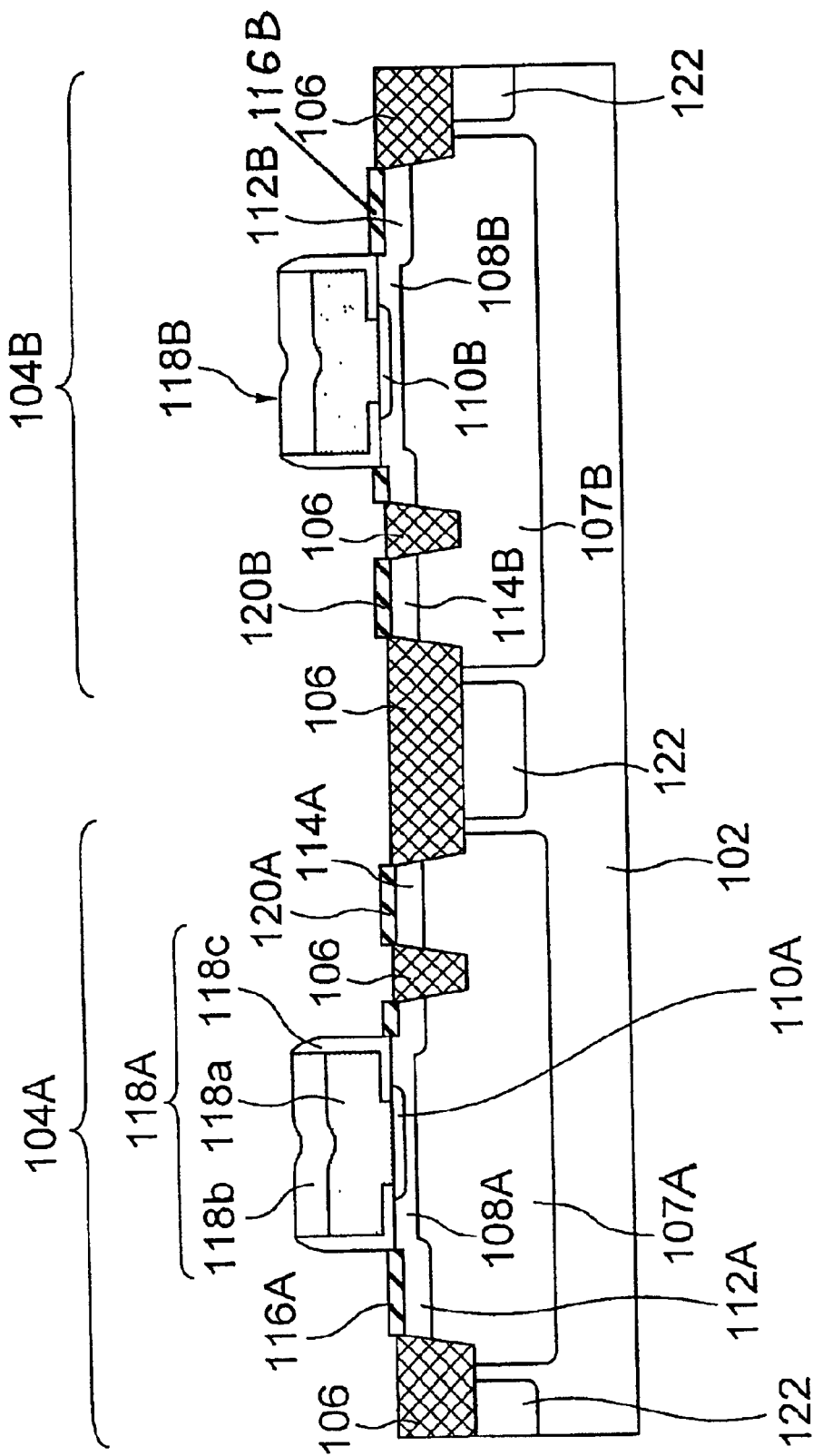
FIG. 2 is a sectional view of the bipolar transistors of FIG. 1 taken along line II—II in FIG. 1.
Figure 3A:
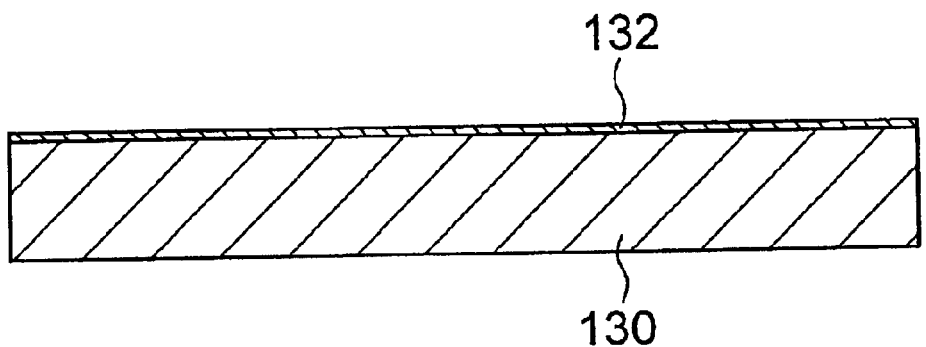
FIGS. 3A to 3F are sectional views of a semiconductor device having a STI structure for consecutively showing the fabrication steps thereof.
Figure 3B:
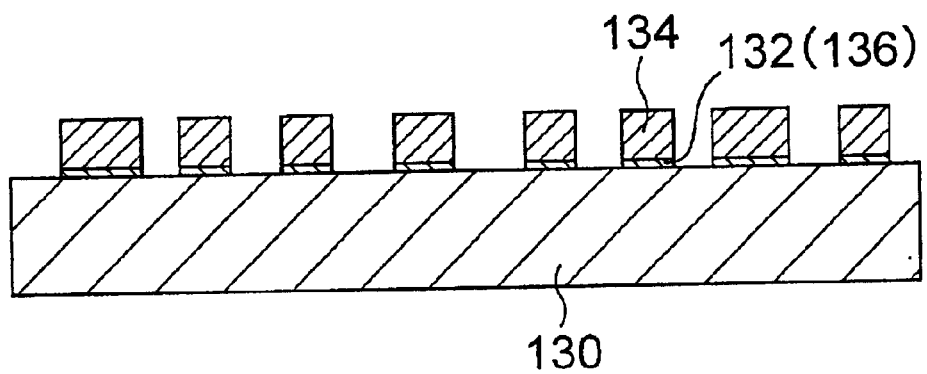
Figure 3C:
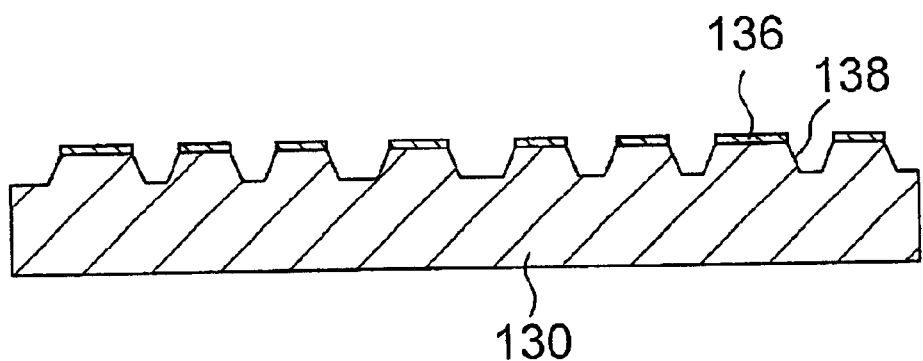
Figure 3D:
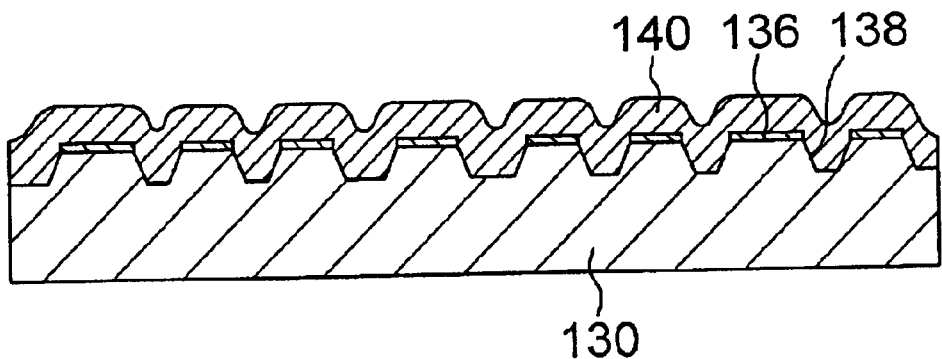
Figure 3E:
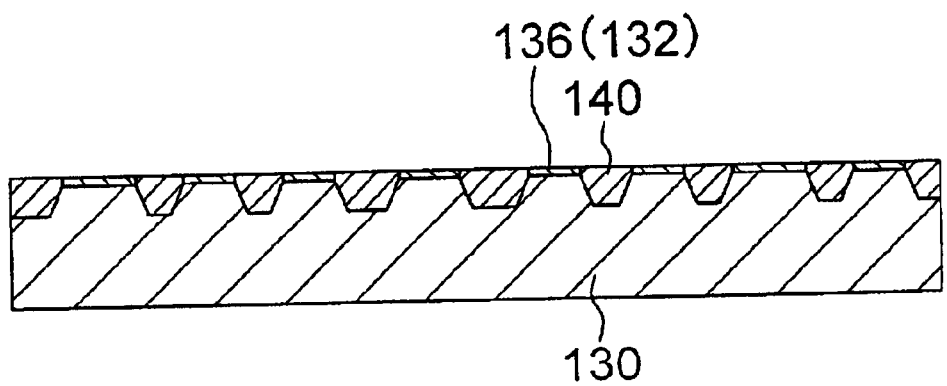
Figure 3F:
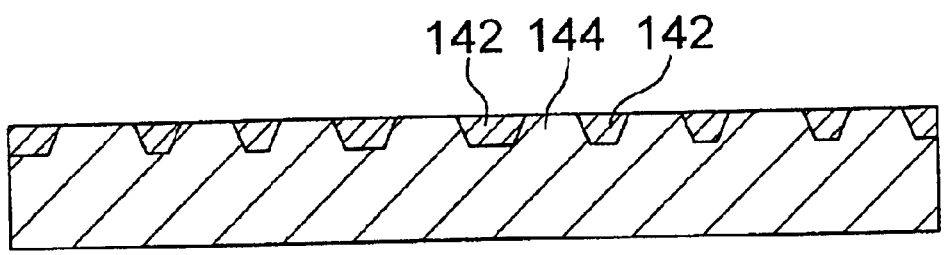
Figure 4A:
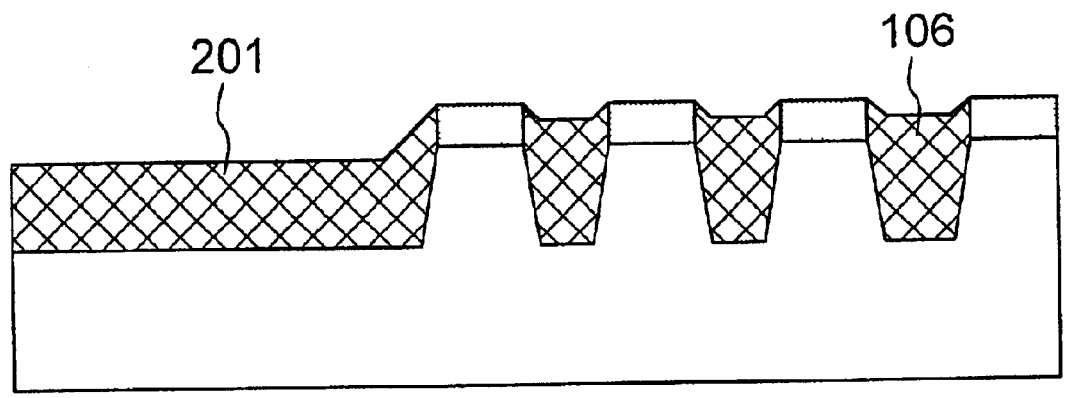
FIGS. 4A and 4B are sectional views of the STI structure shown in FIGS. 3A to 3F for showing the defect of a dishing portion caused by CMP.
Figure 4B:
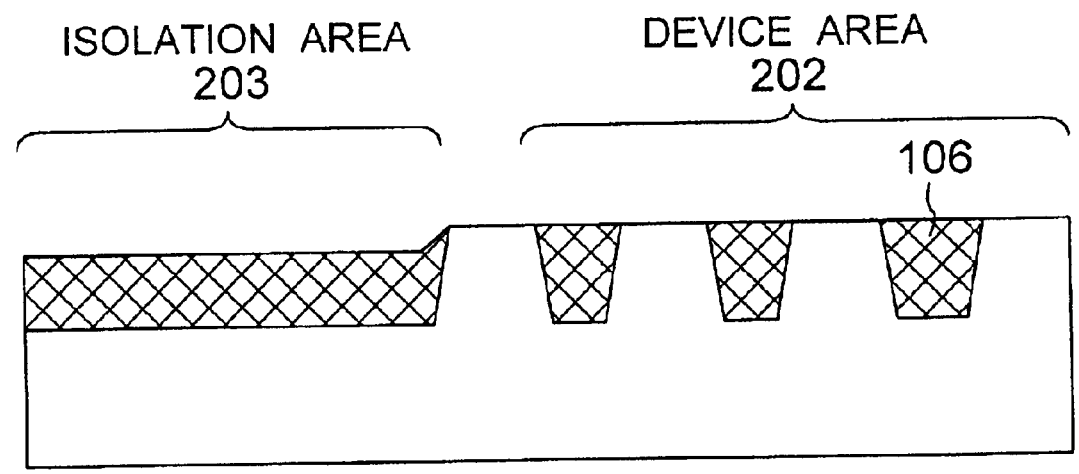
Figure 5A:
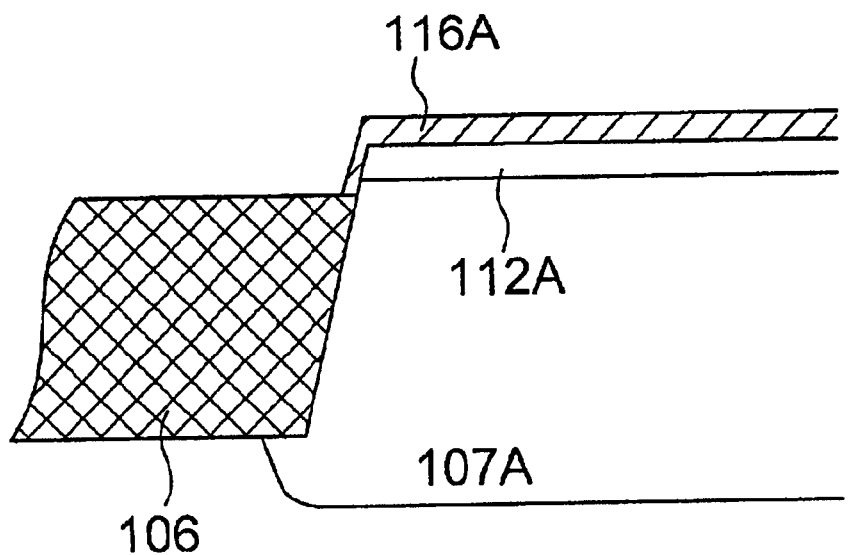
FIGS. 5A and 5B are detailed; partial sectional views of the shallow trench in the STI structure for showing the cause of the degradation in the transistor characteristics.
Figure 5B:
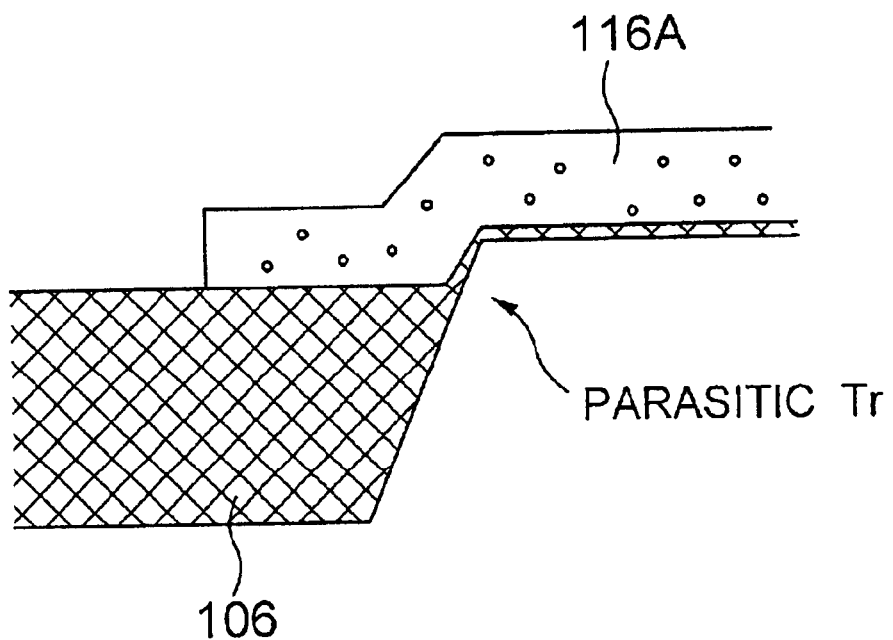
Figure 7:
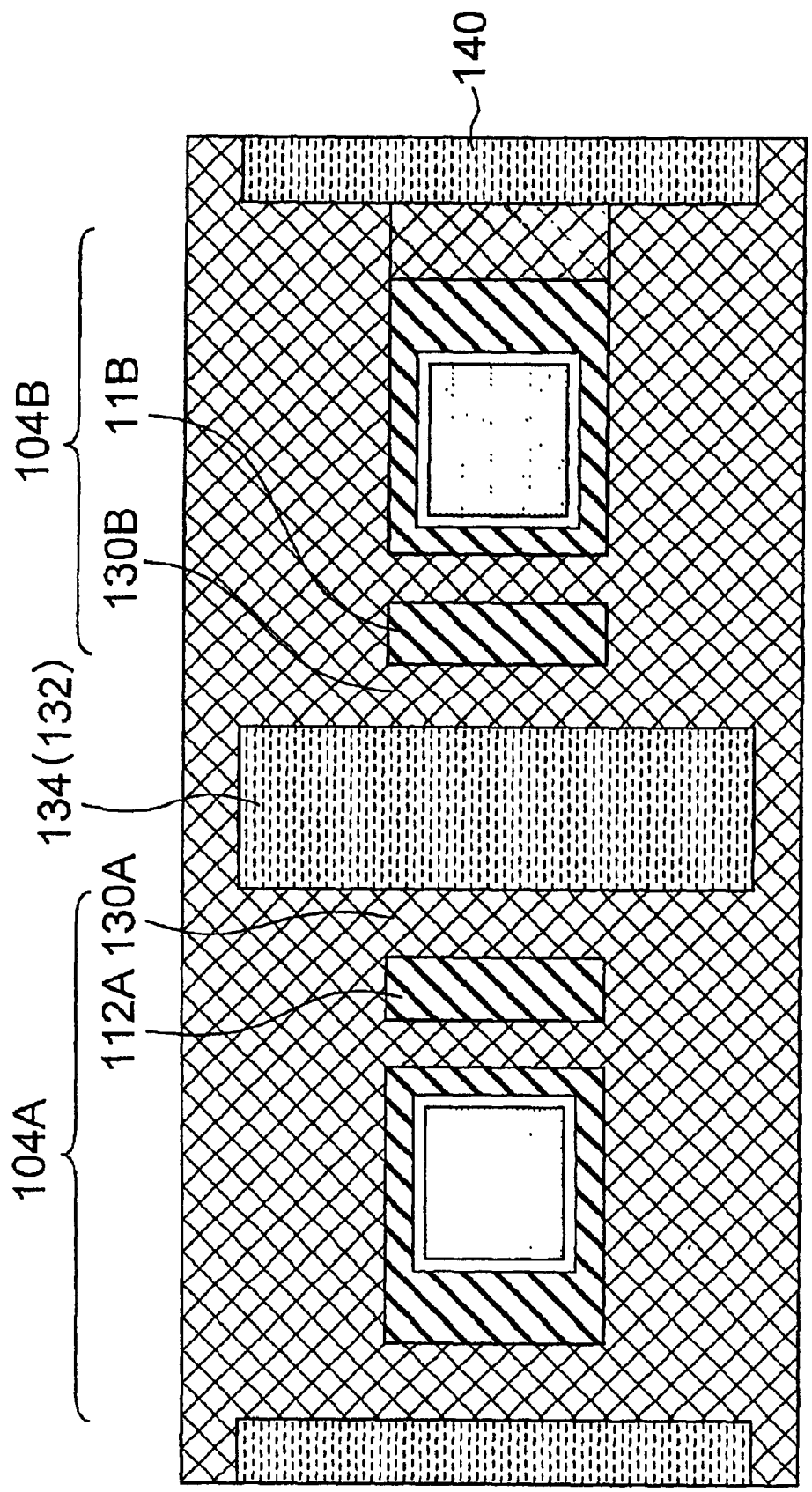
FIG. 7 is a top plan view of the semiconductor device of FIGS. 6A and 6B for showing the problem therein.
Figure 8:
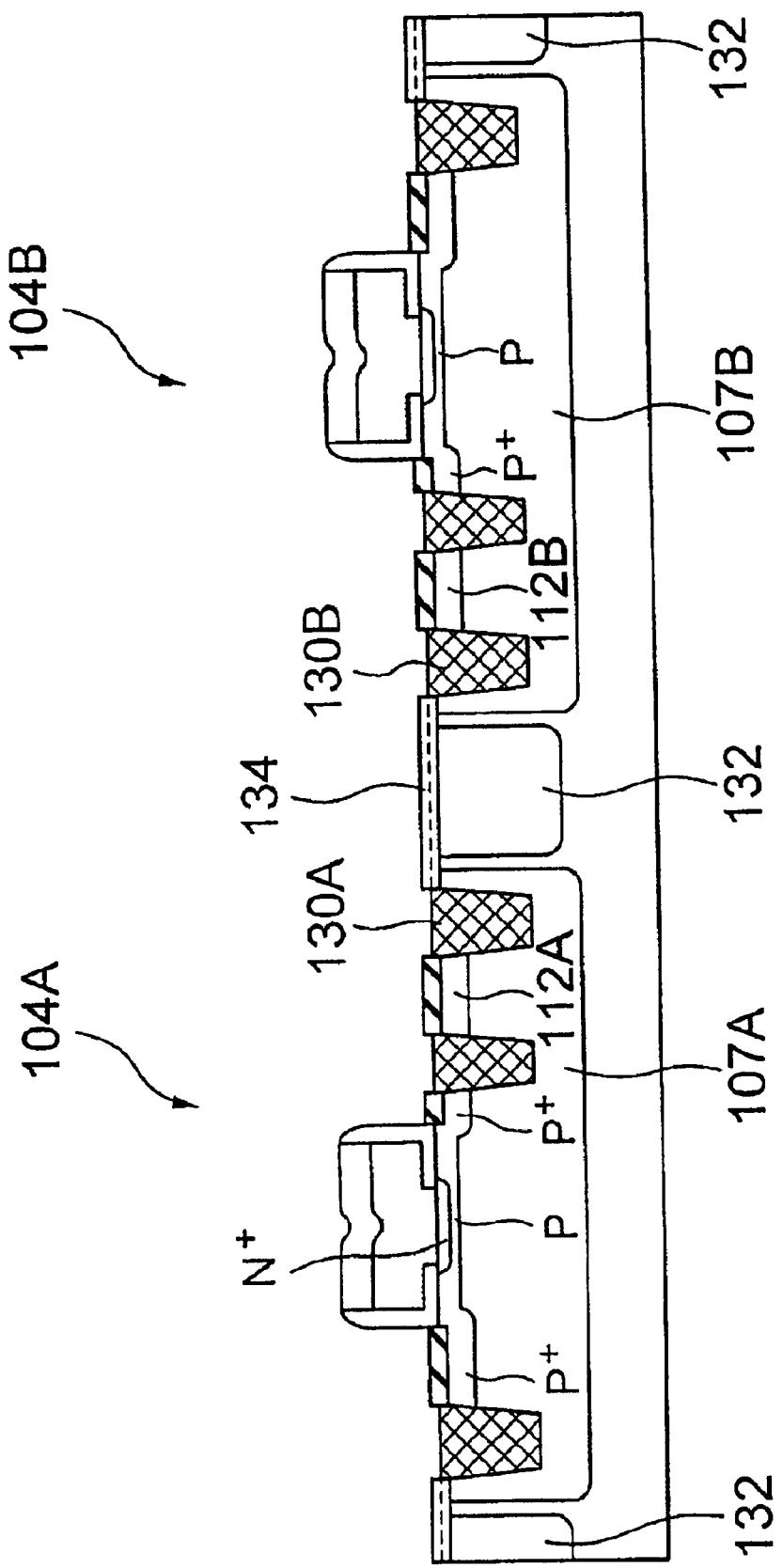
FIG. 8 is a sectional view of the semiconductor device of FIG. 7 for showing the problem therein.

If the LOCOS film 106 in FIG. 2 is replaced by the plurality of shallow trenches shown in FIGS. 6A and 6B, the structure of FIGS. 1 and 2 may be such that shown in FIGS. 7 and 8. Specifically, the wide LOCOS film 106 disposed between the collector contact regions 112A and 112B is replaced by a pair of shallow trenches 130A and 130B and a dummy diffused region 132 disposed therebetween. The top of the dummy diffused region 132 is covered by a silicide layer 134 which is formed during silicification for the base electrode etc. In this structure, the dummy diffused regions 132 functions as a p-well for electrically isolating the n-wells 107A and 107B from each other.

In the structure shown in FIGS. 7 and 8, there is a possibility that a short-circuit failure occurs between the n-well 107A or 107B and the dummy diffused, region 132 through the silicide layer 134, which fact will be understood from the structure shown in FIG. 8. Thus, it is important to prevent the short-circuit failure between the n-well 107A or 107B and the dummy diffused region 132 and between the n-wells 107A and 107B.

The present inventor conceived the STI structure for preventing the short-circuit failure. That is, the structure wherein the diffused region disposed between the first annular diffused region and the second annular diffused region is in contact with the first and second annular diffused regions prevents such a short-circuit failure even if a silicide layer is formed on the annular diffused region.

In the present invention, the density of the convex portions of the silicon substrate is expressed by W×100/S, wherein W is the area for the diffused region disposed between the first annular isolation trench and the second annular isolation trench, and S is the occupied area for an isolation area, i.e., the area between a first annular isolation trench of a first bipolar transistor and another first annular isolation trench of adjacent transistors. It is preferable that the pattern density have a higher value and a preferable pattern density is above 15%. It is also preferable that the gap between adjacent two of the annular diffused regions is below 50 μm.

Figure 9:
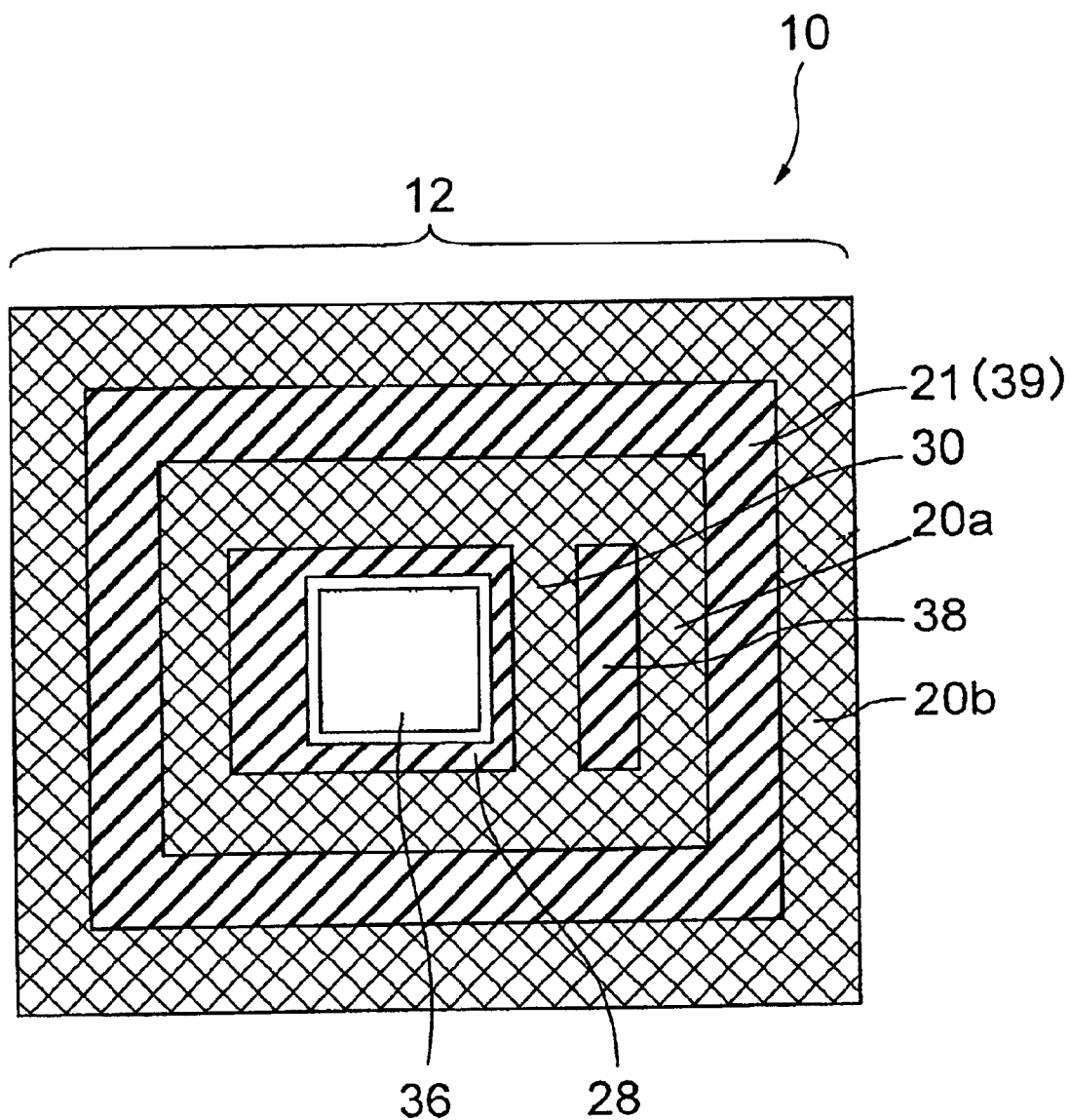
FIG. 9 is a top plan view of a semiconductor device having a STI structure according to a first embodiment of the present invention.
Figure 10:
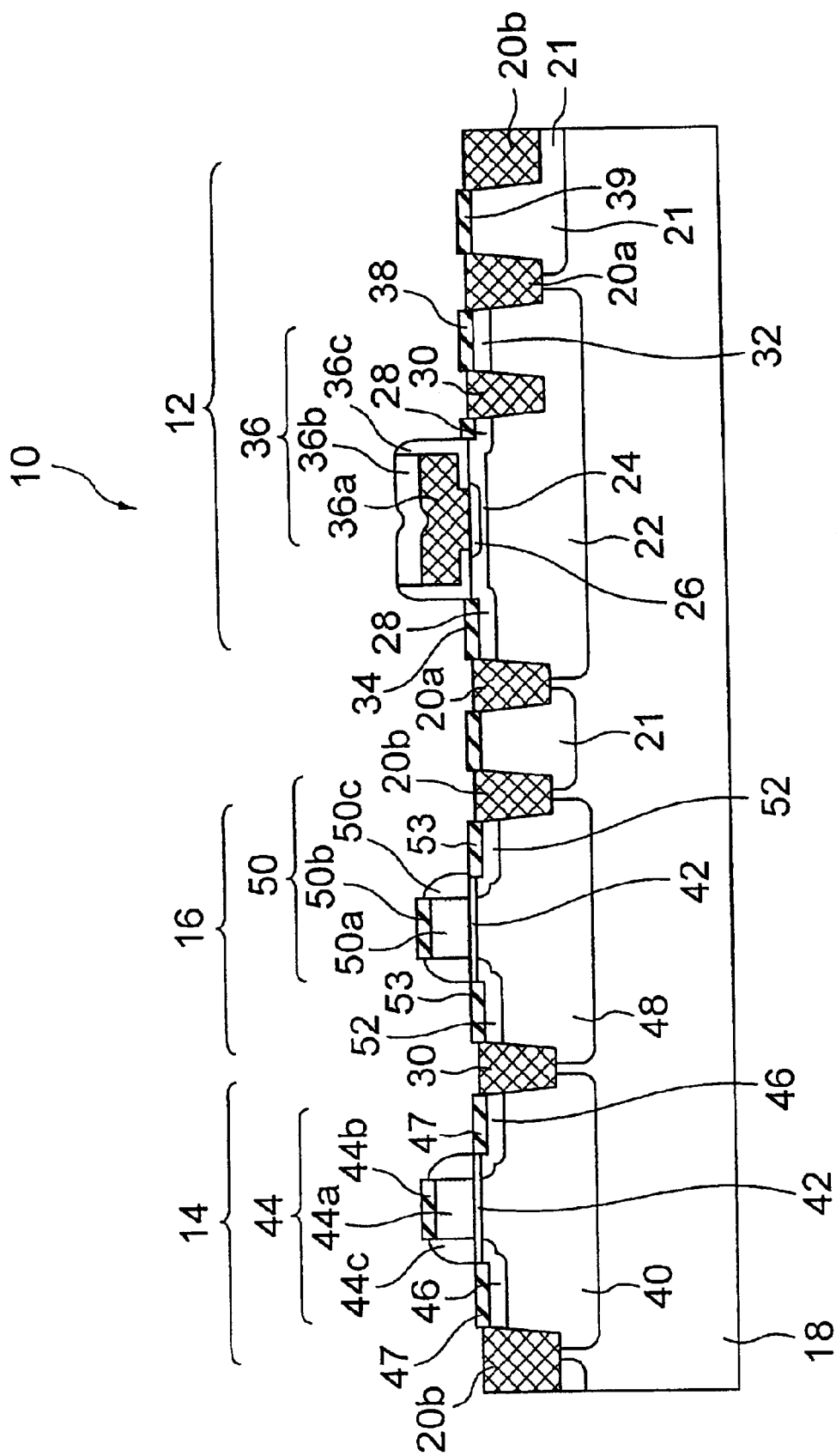
FIG. 10 is a sectional view of the semiconductor device of FIG. 9.

Now, the present invention is more specifically described with reference to preferred embodiments thereof. FIGS. 9 and show a semiconductor device, generally designated by numeral 10, having a STI structure according to a first embodiment of the present invention. FIG. 10 illustrates a nMOSFET 14, a pMOSFET 16 and an NPN bipolar transistor 12, which are formed on a common p-type silicon substrate 18. FIG. 9 illustrates only the device area for the NPN bipolar transistor.

The STI structure in the semiconductor device 10 includes a first annular isolation trench 20a and a second annular isolation trench 20b encircling the first annular isolation trench. Each of the annular isolation trenches has a structure wherein a trench formed on the surface region of the silicon substrate is filled with an insulator such as $SiO_2$. The NPN bipolar transistor 12 is formed in a first area encircled by a first annular isolation trench 20a, which is encircled by a second annular isolation trench 20b. The CMOSFET including the nMOSFET and the pMOSFET is formed in a second area encircled by the second annular isolation trench 20b, with inner isolation trench 30 disposed inside the second annular isolation trench 20b.

The width of the first and second annular isolation trenches 20a and 20b is preferably 0.1 to 10 μm depending on, the layout of the transistor elements in the chip.

The first annular isolation trench 20b for the NPN bipolar transistor 12 encircles an n-well or collector well 22 constituting the collector region of the NPN transistor 12. For the NPN bipolar transistor 12, an annular p-well 21 is disposed between the first annular isolation trench 20a and the second annular isolation trench 20b for encircling the collector well 22. The p-well 21 functions for isolation by forming a p-n junction between the same and the collector well 22. The annular p-well 21 has an inner edge defined by the outer edge of the first annular isolation trench 20a and an outer edge defined by the inner edge of the second annular isolation trench 20b.

The first region for the NPN bipolar transistor 12 defined by the first annular isolation trench 20a includes the n-type collector well 22, a p-type intrinsic base region 24 disposed on the top portion of the collector well 22, an $n^+$-type emitter region 26 disposed on the intrinsic base region 24, and a $p^+$-type extrinsic base region 28 disposed on the intrinsic base region 24 in the vicinity of the emitter region 26.

The top edge portion of the collector well 22 is provided with an $n^+$-type collector contact region 32, which is electrically isolated from the intrinsic base region 24, emitter region 26 and extrinsic base region 28 by an inner annular isolation trench 30 which is encircled by the first annular isolation trench 20a.

The extrinsic base region 28, emitter region 26 and collector contact region 32 are provided with a base electrode 34, an emitter electrode 36 and a collector electrode 38, respectively.

The base electrode 34 and the collector electrode 38 are made of silicide such as $CoSi_2$ or $TiSi_2$. The emitter electrode 36 has a two-layer structure including a polysilicon film 36a and a silicon oxide film 36b, and also includes side walls 36c made of $SiO_2$ formed on the sides of the two-layer structure.

A dummy silicide layer 39 is formed on the top of the p-well 21 between the first annular isolation trench 20a and the second annular isolation trench 20b concurrently with the silicide layer for the base electrode 34 and the collector electrode 38. In a modification, the p-well 21 may have a $p^+$-type top layer, on which the silicide layer 39 is formed.

Each of the nMOSFET 14 and the pMOSFET 16 has a known LDD (lightly doped drain) structure and is formed in the device area isolated from the device area for the NPN bipolar transistor 12 by the first and second isolation trenches 20a and 20b.

The nMOSFET 14 includes a gate electrode 44 disposed on a p-well 40 with an intervention of a gate oxide film 42, and a pair of $n^+$-type source/drain regions 46 formed in the surface region of the p-well 40 in the vicinity of the gate electrode 44. The gate electrode 44 has a two-layer structure including a polysilicon film 44a and an overlying silicide layer 44b, and includes side walls 44c formed on the sides of the two-layer structure. A pair of source/drain electrodes 47 made of silicide, are formed on the source/drain regions 46.

The pMOSFET 16 is isolated from the nMOSFET 14 by the inner isolation trench 30, and includes a gate electrode 50 disposed on an n-well 48 with an intervention of a gate oxide film 42 and a pair of p⁺-type source/drain regions 52 formed in the surface region of the n-well 48 in the vicinity of the gate electrode 50.

The gate electrode 50 has a two layer structure including a polysilicon film 50a and an overlying silicide layer 50b, and includes side walls 50c on the sides of the tow-layer structure. A pair of source/drain electrodes 53 are formed on the respective source/drain regions 52.

Figure 11A:
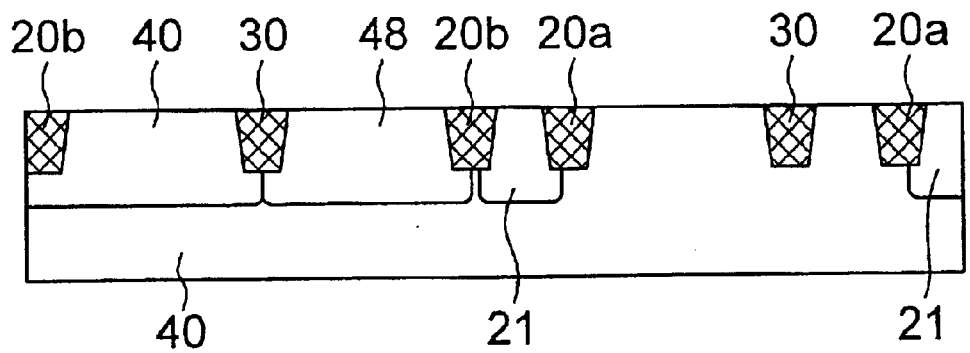
FIGS. 11A to 11F are sectional views of the semiconductor device of the first embodiment for showing consecutive steps of fabrication thereof.

The semiconductor device of the first embodiment is fabricated by the process shown in FIGS. 11A to 11F. As shown in FIG. 11A, first annular isolation trenches 20a, second annular isolation trenches 20b and inner isolation trenches 30 are formed on the surface of the p-type silicon substrate 18, followed by ion implantation into the silicon substrate to form a p-well 21 between the first annular isolation trench 20a and the second annular isolation trench 20b, a p-well 40 in the device area for the nMOSFET 14, and an n-well 48 in the device are for the pMOSFET 16.

The ion-implantation uses a known high-energy implantation technique, wherein phosphorous ions (n-type impurities) are introduced at an acceleration energy of 400 to 800 KeV and a dosage of $1 \times 10^{13}$ to $1 \times 10^{14}$ cm$^{-2}$, and wherein boron ions (p-type impurities) are introduced at an acceleration energy of 150 to 400 KeV and a dosage of $1 \times 10^{13}$ to $1 \times 10^{14}$ cm$^{-2}$.

Figure 11B:
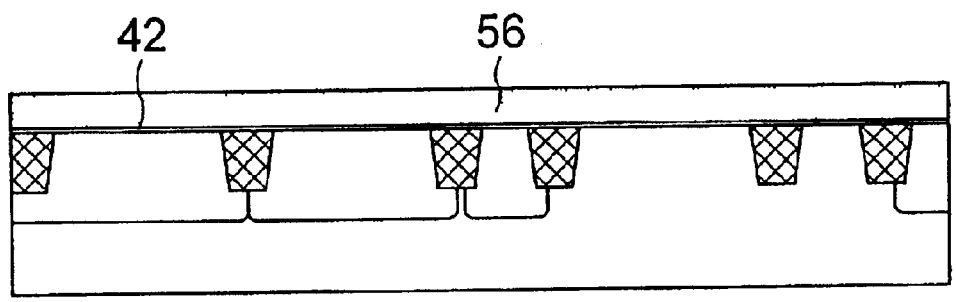
Figure 11C:
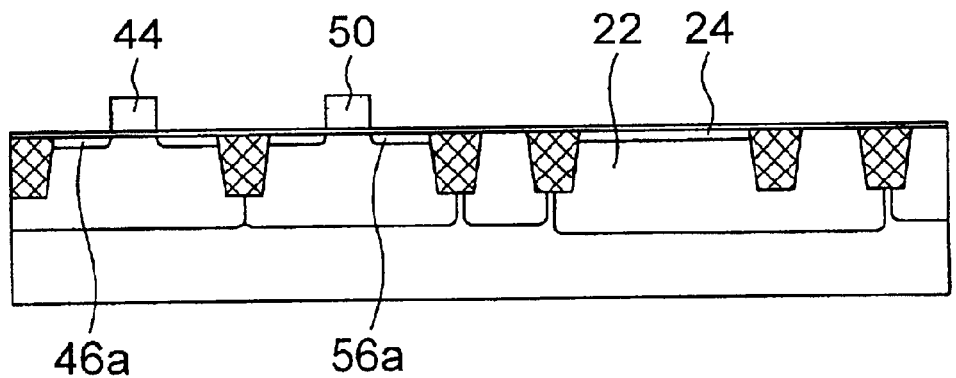

Subsequently, a 2- to 4-nm-thick gate oxide film 42 and a 10- to 25-nm-thick polysilicon film 56 are consecutively formed on the silicon substrate 18, as shown in FIG. 11B. In an alternative, an undoped amorphous silicon film or an amorphous silicon film doped with phosphorous, arsenic, or boron may be used instead of the polysilicon film.

Thereafter, the polysilicon film 56 is subjected to patterning to form gate electrodes 44 and 50, followed by self-alignment ion-implantation steps to form n-type diffused regions 46a and p-type diffused regions 56a, which are aligned with the gate electrodes 44 and 50.

Subsequently, phosphorous ions are implanted at an acceleration energy of 400 to 1000 KeV and a dosage of $1 \times 10^{13}$ to $1 \times 10^{14}$ cm$^{-2}$ to form an n-well 22 in the device area for the NPN bipolar transistor 12, followed by implantation of boron (B) ions at an acceleration energy of several hundreds eV to 4 KeV and a dosage of $1 \times 10^{13}$ to $5 \times 10^{14}$ cm$^{-2}$, or alternatively BF2 at an acceleration energy of 1 to 15 KeV and a dosage of $1 \times 10^{13}$ to $5 \times 10^{14}$ cm$^{-2}$, to form an intrinsic base region 24.

Figure 11D:
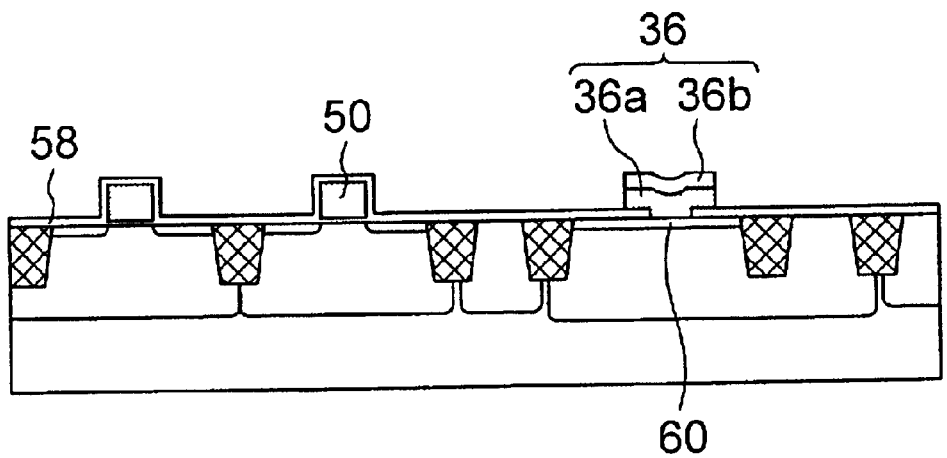
Figure 11E:
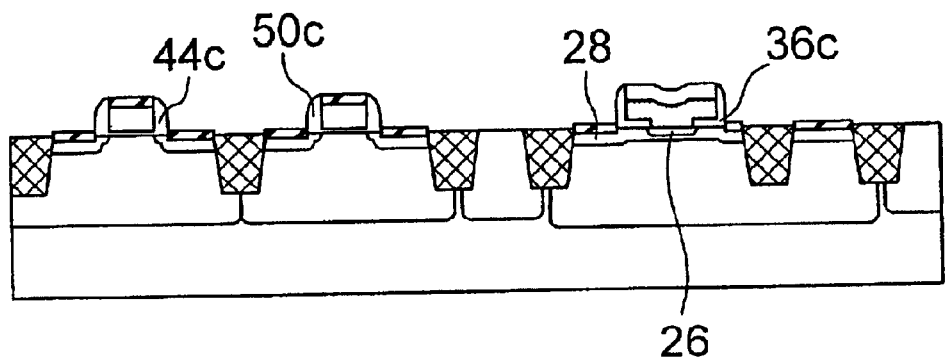
Figure 11F:
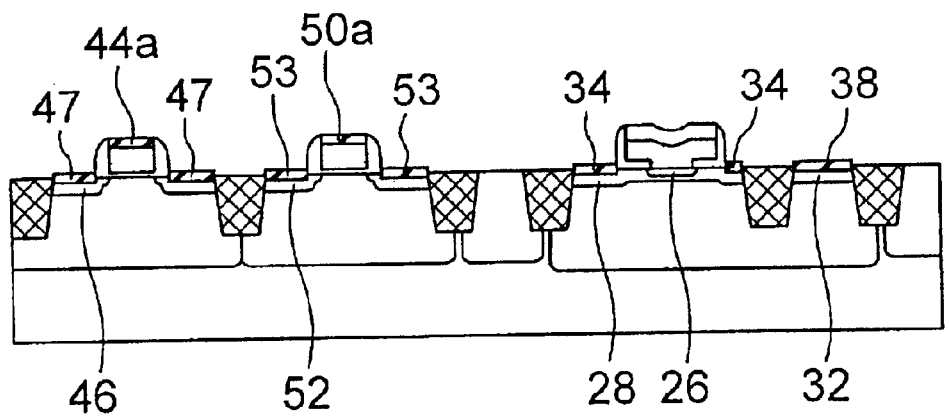

Thereafter, as shown in FIG. 11D, a 20- to 80-nm-thick first LDD oxide film is formed on the entire surface of the substrate, followed by patterning thereof to form an opening 60 therein for exposing the emitter region. Then, a 150- to 300-nm-thick polysilicon film is deposited and a 100- to 200-nm-thick silicon oxide film is grown thereon, followed by patterning of the polysilicon film 36a and the silicon oxide film 36b to form an emitter electrode 36. In an alternative, the polysilicon film may be replaced by an undoped amorphous silicon film or an amorphous film doped with phosphorous or arsenic.

Subsequently, a 40- to 100-nm-thick second LDD oxide film (not shown) is formed on the entire surface of the substrate, followed by a known anisotropic etching to form side walls 44c and 50c on the sides of the gate electrodes 44 and 50, respectively, and side walls 36c on the sides of the emitter electrode 36, the side walls 44c and 50c of the gate electrodes including the first and second LDD oxide films, the side walls 36c including the second LDD oxide film.

Thereafter, by using consecutive ion-implantation steps., a heavily doped n-type diffused region 46, a heavily doped p-type diffused region 52 and a heavily doped p-type diffused region 28 are formed in a self-alignment with respect to the side walls 44c, 50c and 36c. A heavily doped n-type diffused region 32 is also formed. Then, a rapid thermal annealing (RTA) step is conducted to diffuse the impurities in the polysilicon film 36a of the emitter electrode 36 toward the emitter region to form a heavily doped n-type region right under the polysilicon film 36a.

After sputtering cobalt (Co) onto the entire surface of the substrate to a thickness of 5 to 20 nm, the silicon of the substrate and the cobalt are reacted therebetween to form a CoSi$_2$ film, whereby CoSi$_2$ electrodes 47, 44a, 53, 50a, 34 and 38 are formed on the source/drain regions 46 and gate electrode 44 of the nMOSFET 14, source/drain regions and gate electrode of the pMOSFET 16, and the extrinsic base region 28 and collector contact region 32 of the NPN bipolar transistor, respectively.

In the STI structure of the present embodiment, the combination of the first and second isolation trenches 20a and 20b together with the diffused region disposed therebetween constitutes an isolation area, which has a high-density convex portions of the substrate. Thus, CMP of the isolation area does not generate a dishing portion.

Figure 12:
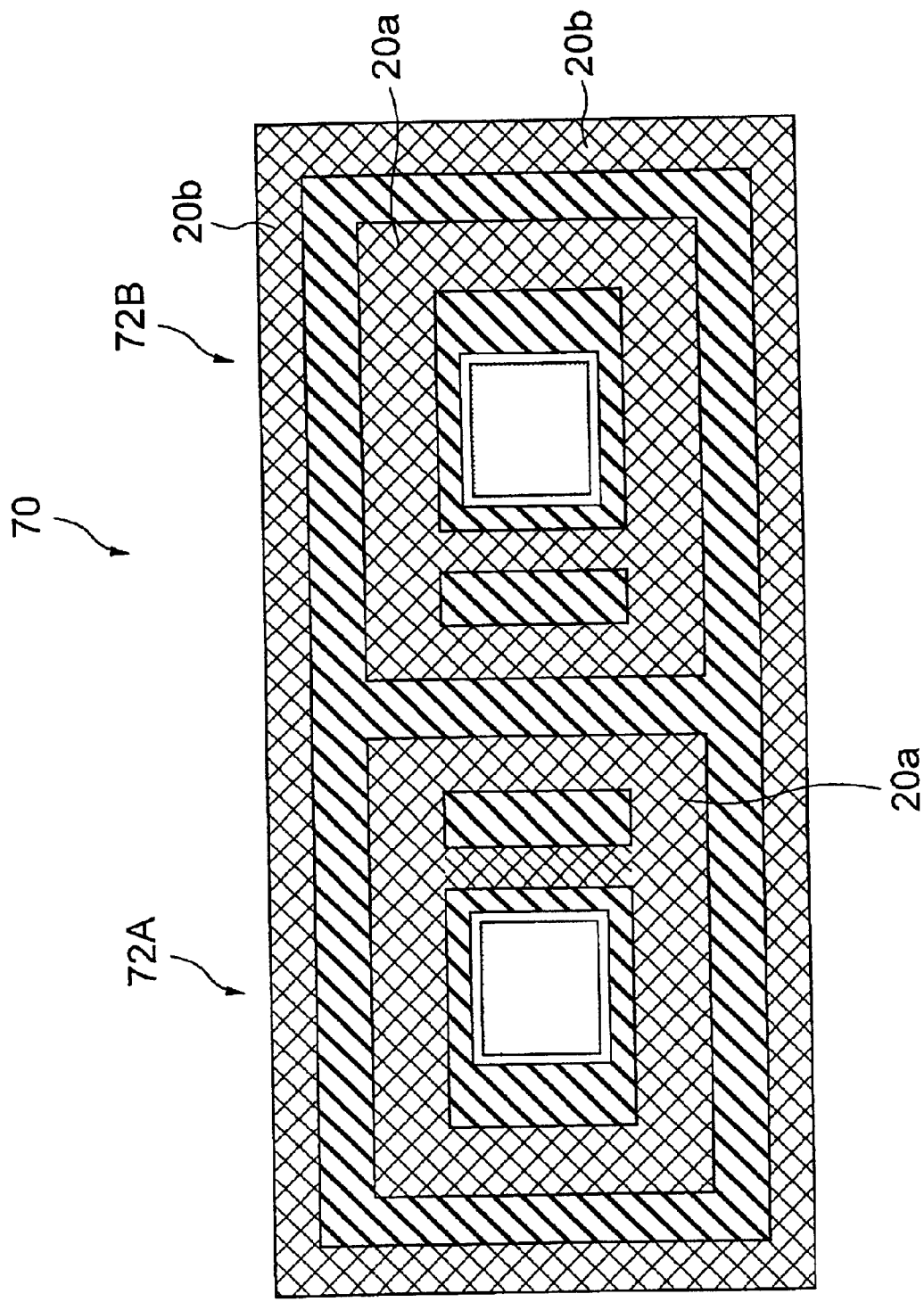
FIG. 12 is a top plan view of a semiconductor device having a STI structure according to a second embodiment of the present invention.
Figure 13:
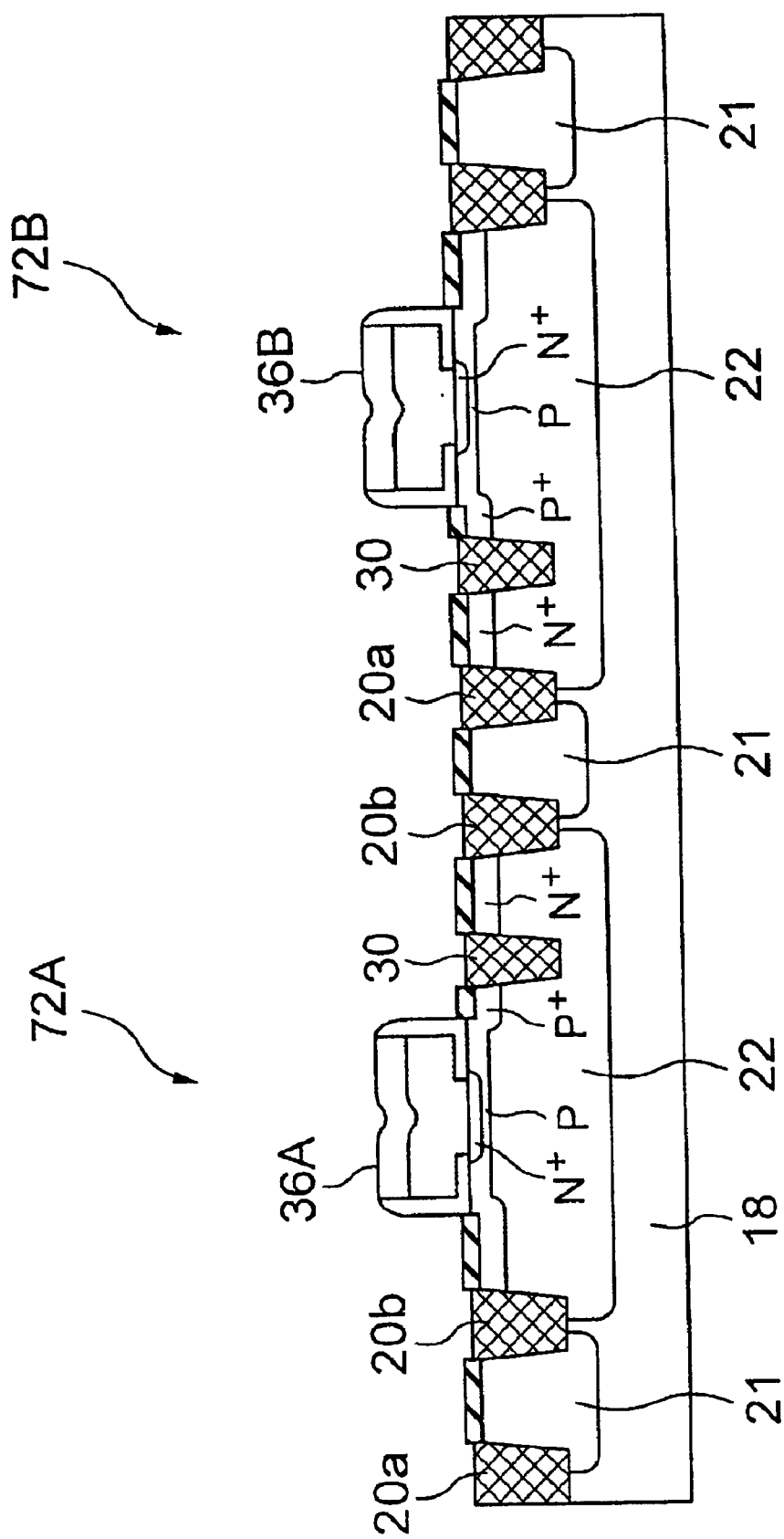
FIG. 13 is a sectional view of the semiconductor device of FIG. 12.

Referring to FIGS. 12 and 13, a semiconductor device having a STI structure according to a second embodiment of the present invention includes a pair of NPN bipolar transistors 72A and 72B disposed in symmetry with respect to a plane passing through the center of a p-well 21. The p-well 21 is disposed for isolation of the pair of NPN bipolar transistors 72A and 72B by forming a p-n junction between the same and the collector well 22 of each of the NPN bipolar transistors 72A and 72B. The configuration of each of the pair of NPN bipolar transistors 72A and 72B as well as the configuration of the isolation trenches 20a, 20b and 30 is similar to the configuration of those shown in FIGS. 9 and 10.

Figure 14:
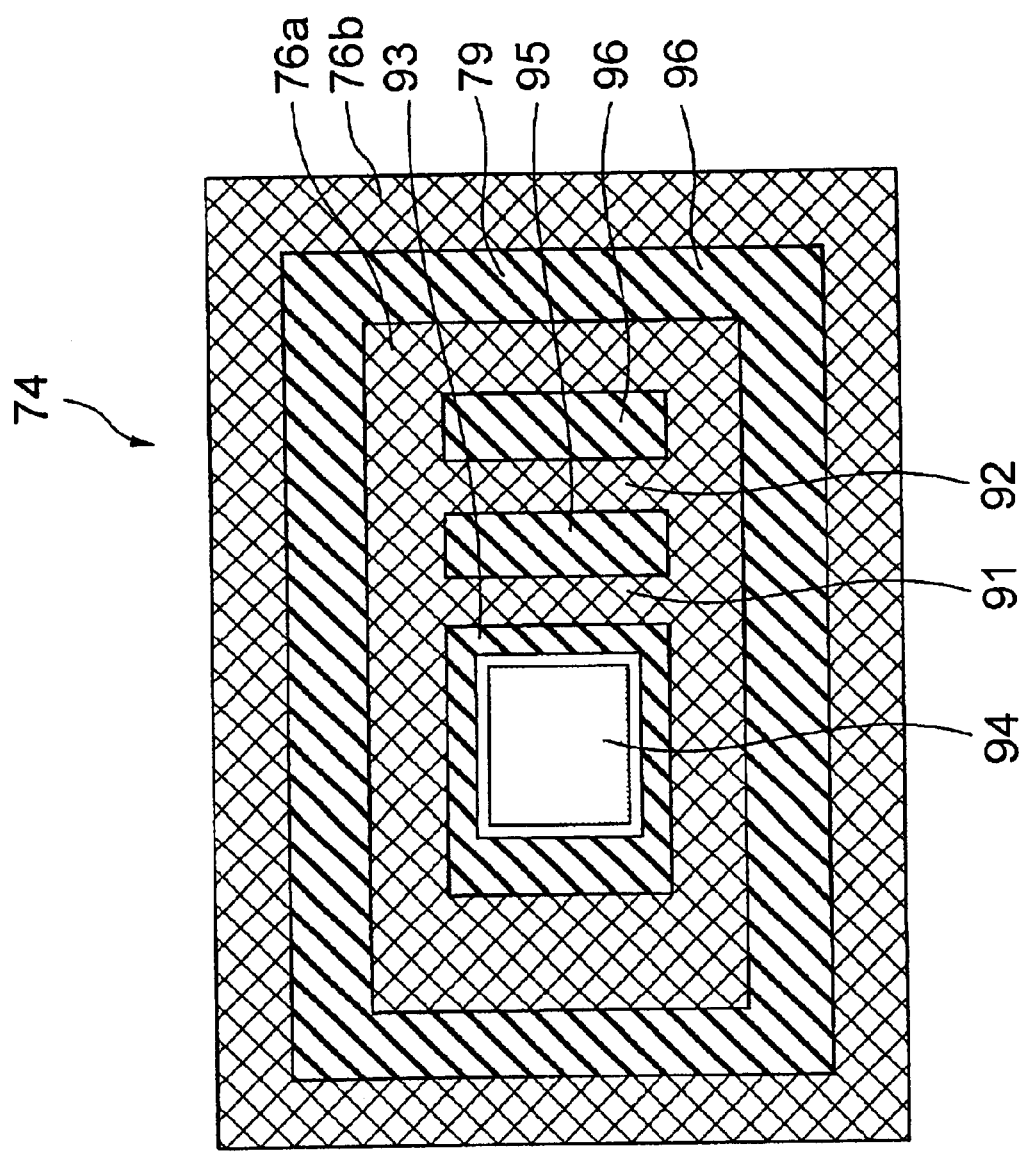
FIG. 14 is a top plan view of a semiconductor device having a STI structure according to a third embodiment of the present invention.
Figure 15:
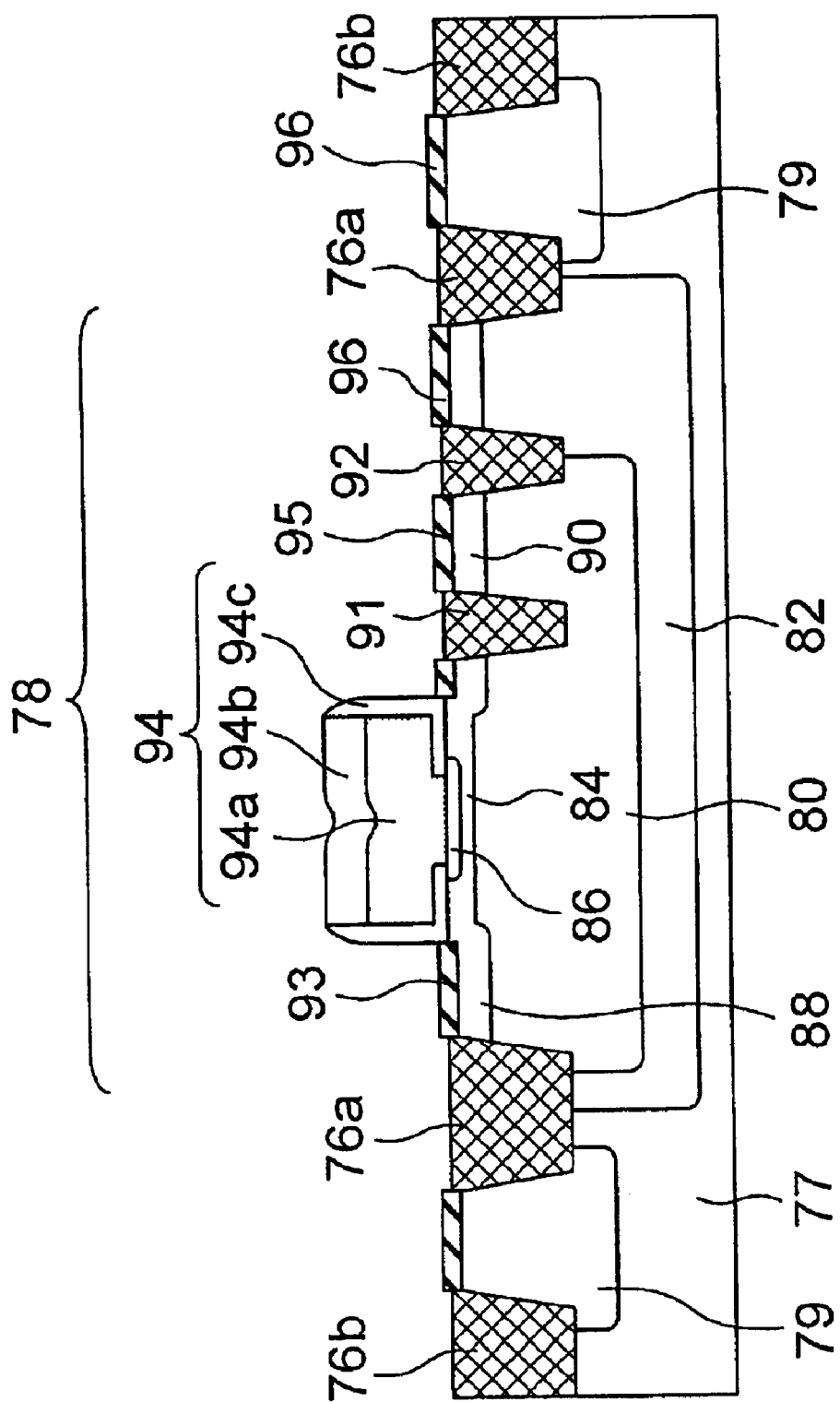
FIG. 15 is a sectional view of the semiconductor device of FIG. 14.

Referring to FIGS. 14 and 15, a semiconductor device having a STI structure according to a third embodiment of the present invention is similar to the first embodiment except that a PNP transistor is formed in an n-well 82 encircled by a first annular isolation trench 76a, and that an inner isolation trench 92 is provided for isolation between the p-type collector region 80 and the n-well 82.

More specifically, the STI structure includes the first annular isolation trench 76a encircling the n-well 82, a second annular isolation trench 76b encircling the first annular isolation trench 76a, the inner isolation trenches 91 and 92.

A p-well 79 is disposed between the first annular isolation trench 76a and the second annular isolation trench 76b for encircling the n-well 82 for isolation thereof.

The n-well 82 receives therein the p-type collector well 80, an n-type intrinsic base region 84 formed on the top of the collector well 80, a p⁺-type emitter region 86 formed on the intrinsic base region 84, an n⁺-type extrinsic base region 88 formed on the intrinsic base region 84 adjacent to the emitter region 86, and a p⁺-type collector contact region 90 formed on the top periphery of the p-type collector region 80.

The collector contact region 90 is isolated from the intrinsic base region 84, emitter region 86 and the extrinsic base region 88 by the inner isolation trench 91 which resides inside the first annular isolation trench 76a. The collector region 80 is isolated from the n-well 82 by the inner isolation trench 92 which resides inside the first annular isolation trench 76a.

The extrinsic base region 88, emitter region 86 and collector contact region 90 are provided with a base electrode 93, an emitter electrode 94 and a collector electrode 95, respectively.

The base electrode 93 and the collector electrode 95 are made of silicide such as $CoSi_2$ and $TiSi_2$. The emitter electrode 94 has a two-layer structure including a polysilicon film 94a and a silicon oxide film 94b, and includes sidewalls 94c formed on the sides of the two-layer structure.

A silicide film 96 is formed on the top of the p-type dummy well 79 between the first annular isolation trench 76a and the second annular isolation trench 76b concurrently with the silicide film formed on the base electrode 93 and the collector electrode 95. A similar silicide film 96 is formed on the top of the n-well 82.

Figure 16:
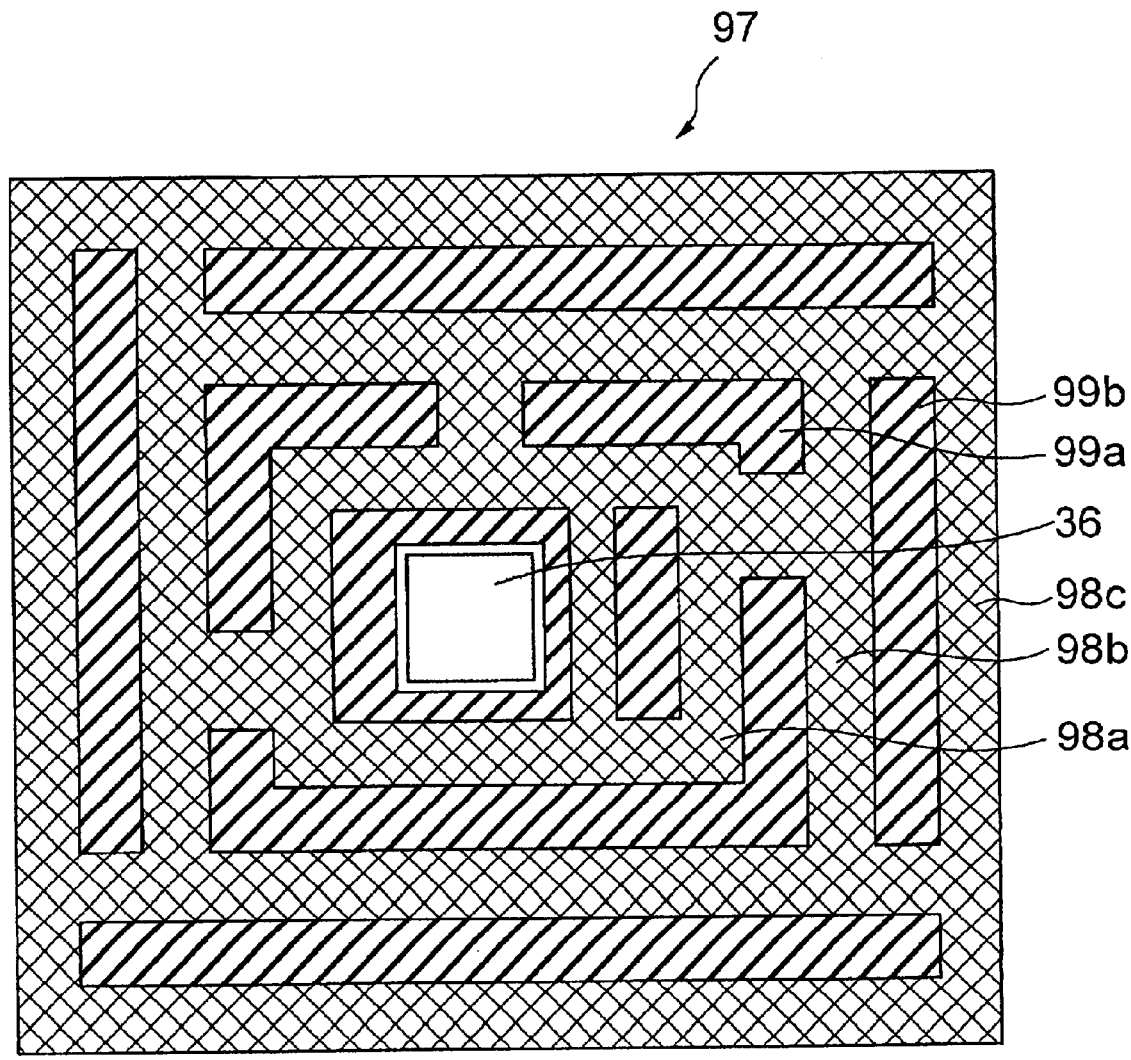
FIG. 16 is a top plan view of a semiconductor device having a STI structure according to a fourth embodiment of the present invention.

Referring to FIG. 16, a semiconductor device having a STI structure according to a fourth embodiment of the present invention is similar to the first embodiment except for the structure of the isolation trenches for the NPN bipolar transistor.

More specifically, the semiconductor device of the present embodiment includes a first annular isolation trench 98a for encircling the n-type collector well of the NPN transistor 12, a second annular isolation trench 98b encircling the first annular isolation trench 98a, and a third annular isolation trench encircling the second annular isolation trench 98b.

A plurality of first p-type diffused regions 99a are disposed between the first annular isolation trench 98a and the second annular isolation trench 98b for collectively forming an intermittent annular diffused region which encircles the collector well. A plurality of second p-type diffused regions 99b are disposed between the second annular isolation trench 98b and the third annular isolation trench 98c for collectively forming an intermittent annular diffused region. The intermittent diffused regions 99a and 99b have an isolation function by forming a p-n junction between the same and the n-type collector region. The first p-type diffused regions and the second p-type diffused regions are disposed alternatively as viewed along the annular diffused regions. In other words, any line extending in a radial direction, with the emitter region viewed as a center of a circle, passes inside the first p-type diffused regions 99a and/or the second p-type diffused regions 99b without fail.

In an alternative of the fourth embodiment of the present invention, each of the intermittent annular diffused regions is replaced by a continuous annular diffused region. In this configuration, the isolation function of the isolation area can be improved.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising a silicon substrate, and a bipolar transistor having a collector well having a first conductivity-type, an internal base region having a second conductivity-type and received in said collector well and an emitter region having said first conductivity-type and received in said internal base region, a first annular isolation trench encircling said collector well, a second annular isolation trench encircling said first annular isolation trench, and an annular diffused region having said second conductivity-type disposed between said first annular isolation trench and said second annular isolation trench while being in contact with said first and second annular isolation trenches, said annular diffused region having only one layer of material laid on top of an entirety of said annular diffused region.

2. The semiconductor device as defined in claim 1, wherein said internal base region and said collector well are provided with a base electrode and a collector electrode, and each of said base electrode, said collector electrode and said annular diffused region is provided with a silicide layer on top thereof.

3. The semiconductor device as defined in claim 1, further comprising a MOSFET.

4. The semiconductor device as defined in claim 1, wherein said annular diffused region includes a first intermittent annular sub-region including a plurality of first diffused regions and a second intermittent annular sub-region including a plurality of second diffused regions, and said first diffused regions and said second diffused regions are arranged alternately along said annular diffused region.

5. The semiconductor device as defined in claim 4, further comprising a third annular isolation trench disposed between said first intermittent annular region and said second intermittent annular region.

6. The semiconductor device as defined in claim 1, wherein said silicon substrate has said second conductivity-type.

7. The semiconductor device as defined in claim 6, wherein said first conductivity-type is n-type and said second conductivity-type is p-type.

8. The semiconductor device as defined in claim 6, wherein said silicon substrate has said first conductivity-type, and includes a well having said second conductivity-type and receiving therein said collector well.

9. The semiconductor device as defined in claim 8, wherein said bipolar transistor is a PNP transistor.

10. The semiconductor device as defined in claim 1, further comprising a third annular isolation trench encircling said second annular isolation trench, and another annular diffused region disposed between said second annular isolation trench and said third annular isolation trench while being in contact with said second and third annular isolation trenches.

* * * * *